(12) United States Patent
Qutub et al.

(10) Patent No.: US 10,045,104 B2
(45) Date of Patent: Aug. 7, 2018

(54) AUDIO CALIBRATION USING A MICROPHONE

(71) Applicant: Knowles Electronics, LLC, Itasca, IL (US)

(72) Inventors: Sarmad Qutub, Des Plaines, IL (US); Paul Smith, Bartlett, IL (US); Michael Pate, Bartlett, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/244,785

(22) Filed: Aug. 23, 2016

(65) Prior Publication Data

US 2017/0064424 A1 Mar. 2, 2017

Related U.S. Application Data

(60) Provisional application No. 62/209,028, filed on Aug. 24, 2015.

(51) Int. Cl.
| | | |
|---|---|---|
| *H04R 1/00* | (2006.01) | |
| *H04R 1/04* | (2006.01) | |
| *H04R 29/00* | (2006.01) | |
| *H04R 19/04* | (2006.01) | |
| *H03M 1/10* | (2006.01) | |

(52) U.S. Cl.
CPC .............. *H04R 1/04* (2013.01); *H04R 29/004* (2013.01); *H03M 1/1009* (2013.01); *H04R 19/04* (2013.01); *H04R 2201/003* (2013.01)

(58) Field of Classification Search
CPC .... H04R 2201/003; H04R 19/04; H04R 1/04; H04R 29/004; H03M 1/1009
See application file for complete search history.

(56) References Cited

U.S. PATENT DOCUMENTS

| | | |
|---|---|---|
| 5,822,598 A | 10/1998 | Lam |
| 6,070,140 A | 5/2000 | Tran |
| 6,154,721 A | 11/2000 | Sonnic |
| 6,249,757 B1 | 6/2001 | Cason |
| 6,397,186 B1 | 5/2002 | Bush et al. |
| 6,756,700 B2 | 6/2004 | Zeng |
| 7,415,416 B2 | 8/2008 | Rees |
| 7,774,204 B2 | 8/2010 | Mozer et al. |
| 7,957,972 B2 | 6/2011 | Huang et al. |
| 8,275,148 B2 | 9/2012 | Li et al. |
| 8,666,751 B2 | 3/2014 | Murthi et al. |
| 8,972,252 B2 | 3/2015 | Hung et al. |
| 8,996,381 B2 | 3/2015 | Mozer et al. |
| 9,043,211 B2 | 5/2015 | Haiut et al. |
| 2006/0074658 A1 | 4/2006 | Chadha |
| 2012/0232896 A1 | 9/2012 | Taleb et al. |
| 2012/0310641 A1 | 12/2012 | Niemisto et al. |

(Continued)

*Primary Examiner* — Muhammad N Edun
(74) *Attorney, Agent, or Firm* — Foley & Lardner LLP

(57) ABSTRACT

A microphone that includes a calibration signal generator that generates a calibration signal based upon a received invocation input. The calibration signal has known audio properties. The microphone also includes a transducer that converts sound energy into an electrical signal. An integrated circuit receives the electrical signal from the transducer. An external microphone interface provides the calibration signal to a device external to the microphone.

20 Claims, 2 Drawing Sheets

(56) References Cited

U.S. PATENT DOCUMENTS

| | | |
|---|---|---|
| 2013/0044887 A1* | 2/2013 | Dong ................. H04R 3/00 381/59 |
| 2013/0223635 A1 | 8/2013 | Singer et al. |
| 2014/0163978 A1 | 6/2014 | Basye et al. |
| 2014/0244269 A1 | 8/2014 | Tokutake |
| 2014/0257821 A1 | 9/2014 | Adams et al. |
| 2014/0274203 A1 | 9/2014 | Ganong et al. |
| 2014/0278435 A1 | 9/2014 | Ganong et al. |
| 2014/0281628 A1 | 9/2014 | Nigam et al. |
| 2014/0343949 A1 | 11/2014 | Huang et al. |
| 2015/0106085 A1 | 4/2015 | Lindahl |
| 2015/0112690 A1 | 4/2015 | Guha et al. |
| 2015/0134331 A1 | 5/2015 | Millet et al. |

* cited by examiner

AUDIO CALIBRATION USING A MICROPHONE

CROSS-REFERENCE TO RELATED APPLICATIONS

This application claims the benefit of and priority to U.S. Provisional Patent Application No. 62/209,028, filed Aug. 24, 2015, the entire contents of which are incorporated herein by reference.

TECHNICAL FIELD

This disclosure relates to micro electro mechanical system (MEMS) microphones and, more specifically, to the operation of these devices and methods therefor.

BACKGROUND

Different types of acoustic devices have been used through the years. One type of device is a microphone and one type of microphone is a micro electro mechanical system (MEMS) microphone. Microphones are deployed in various types of devices such as personal computers or cellular phones. In a MEMS microphone, a diaphragm moves with incoming sound, and the movement of the diaphragm with respect to the back plate creates an electrical signal representative of the sound or acoustic energy at the input. Other types of transducers can also be used in microphones.

Complex audio systems include other elements and receive their inputs either directly or indirectly from the microphones in a signal path. Such downstream elements often carry out multiple processing functions that require tuning to achieve optimal performance. Conventional approaches for debugging and calibration require a calibrated acoustic stimulus (e.g., tone or sweep) to calibrate the rest of the signal path. This, in turn, has required complex set-ups, increased test times, and introduces another potential source of error into the system. Additionally, consideration must also be made for changes in frequency and phase response due to particular types or configurations of gasketing and/or porting.

Many users do not have adequate acoustic experience to set up a proper testing environment. As a result, many hours and even days can be spent debugging problems.

The above limitations have led to some user dissatisfaction with previous approaches.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide microphones that for a given start-up sequence transmit a calibrated output signal without any external audio stimulus such as a speaker. More specifically and in one aspect, the microphone may receive an electronic indication, invocation signal, or invocation command from an external processing device. The indication may be of a variety of different electronic forms such as an electronic command (e.g., I2C command), specified clock frequency changes of an electrical signal (e.g., a clock signal), or applied voltage levels to mention a few examples. An integrated circuit or other circuitry at the microphone may generate a calibrated signal that is either applied to a transducer of the microphone or directly output from the microphone.

Advantageously, the present approaches allow the tuning and calibrating of components of an audio system without the use of an audio stimulus (e.g., speech, voice, or other acoustic energy). The present approaches are unaffected by specific porting or gasketing specifications or configurations. The present approaches significantly reduce calibration and debugging times for users.

Figure 1:
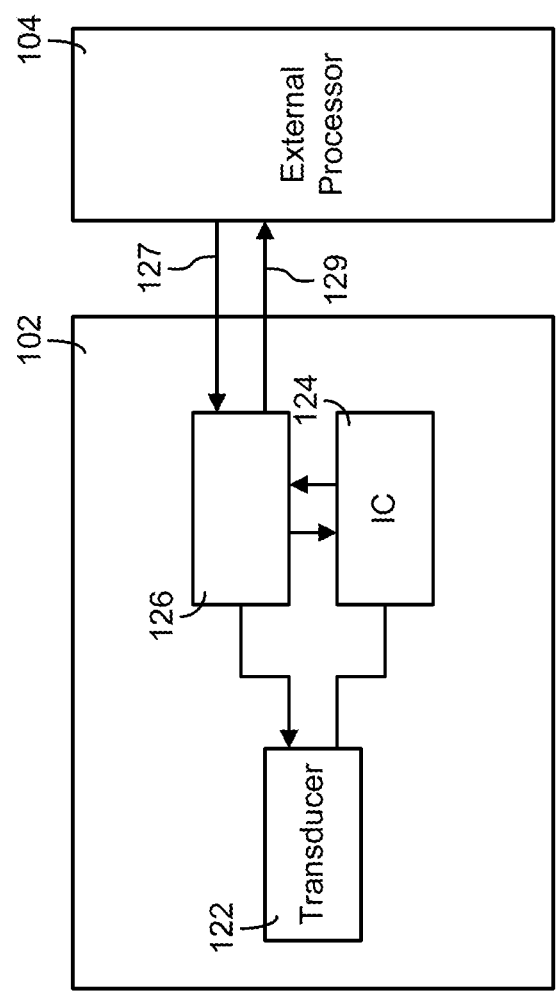
FIG. 1 is a block diagram of microphone system with calibration features.

Referring now to FIG. 1, one example of a system 100 that generates a calibration signal without an external audio stimulus is described. The system 100 includes a microphone 102 and an external processor 104. The external processor 104 may be a digital signal processor (DSP), system on chip (SoC), codec, or any combination of these or other devices. It will be appreciated that the external processor may be coupled to other devices (e.g., at its output) and these other devices, in turn, may be coupled to other devices. Invocations for the microphone to enter into calibration mode may originate at or from any of these devices.

The microphone 102 includes a transducer 122, an integrated circuit 124, and a calibration signal generation module 126. In one aspect, the microphone 102 operates in multiple modes including a calibration mode where a calibration signal is transmitted from the microphone. For example, the microphone 102 may operate in a sleep mode and an active mode. Other examples of modes are possible. It will be appreciated that the microphones described herein can transition through a variety of these different modes in any sequence.

The transducer 122 converts sound energy into an electrical signal. In one aspect, the transducer is a micro electro mechanical system (MEMS) device that converts sound energy into an electrical signal. The electrical signal can be converted into a digital format by other circuitry (not shown in FIG. 1).

The integrated circuit 124 may receive audio signals from the transducer 122 and processes these signals. For example, the integrated circuit 124 may perform filtering or amplification functions on the signals received from the transducer 122. Other examples of processing functions are possible. In one example, the integrated circuit 124 may be an application specific integrated circuit (ASIC). Other examples of integrated circuits are possible.

The calibration signal generation module 126 generates a calibration signal 129 when the calibration signal generation module 126 is invoked or actuated by invocation 127. As explained elsewhere herein, the calibration mode can be invoked by a variety of different invocations or indications 127 including with invocation commands from the external processing device 104. Other invocation approaches are possible. The calibration signal generation module 126 may be constructed using any combination of hardware and/or software elements. The calibration signal generation module 126 may be a stand-alone element or incorporated into the integrated circuit 124. In some examples, the invocation 127 is received by integrated circuit 124 and passed on to the calibration signal generation module 126. The calibration signal generated by calibration signal generation module 126 is passed to the integrated circuit 124, which transmits it to one or both of the transducer 122 and the external processor 104.

By a "calibrated signal" and as used herein, it is meant a signal with known properties that can be used by other devices to tune and debug their operations relative to the calibrated signal. In one example, the calibrated signal 129 calibrates, synchronizes, or otherwise comports the operations (e.g., algorithmic processing applications) of external processor 104 to the operation of the microphone 102. This may involve a user manually tuning operations of the processor 104 to comport with or according to the calibrated signal. Other devices coupled downstream from the external processor 104 may also utilize (directly or indirectly) the calibrated signal 129 from the microphone 122.

It will be appreciated that other circuitry may also be disposed in the microphone 102, such as circuitry that converts the analog signal into digital signals that are utilized by the integrated circuit 124. Additionally, it will be appreciated that the microphone 102 may interface with other processing and/or non-processing elements according to any protocol or standard. For example, the I2C protocol can be used by the microphone to interface with other processing elements. Such a protocol may include or utilize particular physical electrical lines including a SELECT (or SEL) line, a CLK (or clock line), one or more DATA lines, and power (Vdd) lines. Other examples are possible. In other words, the invocation 127 may arrive at the microphone 102 over a variety of different physical lines (e.g., SELECT (or SEL) line, a CLK (or clock) line, one or more DATA lines, or power (Vdd) lines). Additionally, the calibrated signal 129 may leave the microphone 102 over a variety of different physical lines (e.g., over a DATA line). The particular lines (e.g., SELECT (or SEL) line, a CLK (or clock line), one or more DATA lines, and/or power (Vdd) lines) are not shown in FIG. 1 for simplicity.

In one example of the operation of the system of FIG. 1, an audio signal is received by the microphone 102. The transducer 122 receives the signal and converts it into an electrical signal. In one aspect, additional circuitry converts the signal created by the transducer 122 into a digital signal for use by the external processor 104.

It will be understood that the calibration mode may be invoked according to a variety of different approaches. In one example, a command (e.g., I2C command) is received from the external processor 104. In another example, a high frequency command or indicator is received over a particular line and received by the microphone 102 (e.g., a Vdd line, CLK line, or SEL or SELECT line). In another example, the SELECT line is pulled high or low in a predefined pattern, e.g., high, low, high within 100 ms. In another example, a specified clock pattern is received by the microphone, e.g., 512 kHz in a first time period, 2400 kHz in a second time period, 3072 kHz in a third time period, and 2400 kHz in a fourth time period. This may be received over a CLK line. In another example, a specified clock frequency is supplied over the CLK line to the microphone to enter calibration or test mode. In yet another example, the microphone is powered at a specified VDD to put the microphone in transmit/test mode. In still another example, a predetermined voltage is applied to the SELECT line.

Once the indication for mode change (to send a calibration signal), is received by the microphone 102, the calibration signal generation module 126 generates a calibration signal. The calibration signal may be directly output from the microphone 102 (e.g., over a DATA or some other line). In another aspect, the calibration signal may be applied to the transducer 122. Application of the calibration signal to the transducer 122 allows the inclusion of the transducer 122 and integrated circuit 124 in the tuning and debugging process. In one aspect, this provides a more complete solution to the debugging process because the transducer 122 and integrated circuit 124 are included in calibration.

By application of the calibration signal to the transducer and integrated circuit as described herein, it is meant that the calibration signal travels electrically through both (through the internal electrical and/or mechanical components of the transducer and integrated circuit) and ensures that there are no unexpected artifacts due to either the transducer or integrated circuit. For example, if the calibration signal is applied to the transducer and then consequentially to the integrated circuit and the output of the signal is unaltered as expected, it can be determined that the transducer and integrated circuit are functioning per the design and it is not a defective part. If the signal is altered, then it can be determined that the part is defective due to either the transducer or the integrated circuit.

Figure 2:
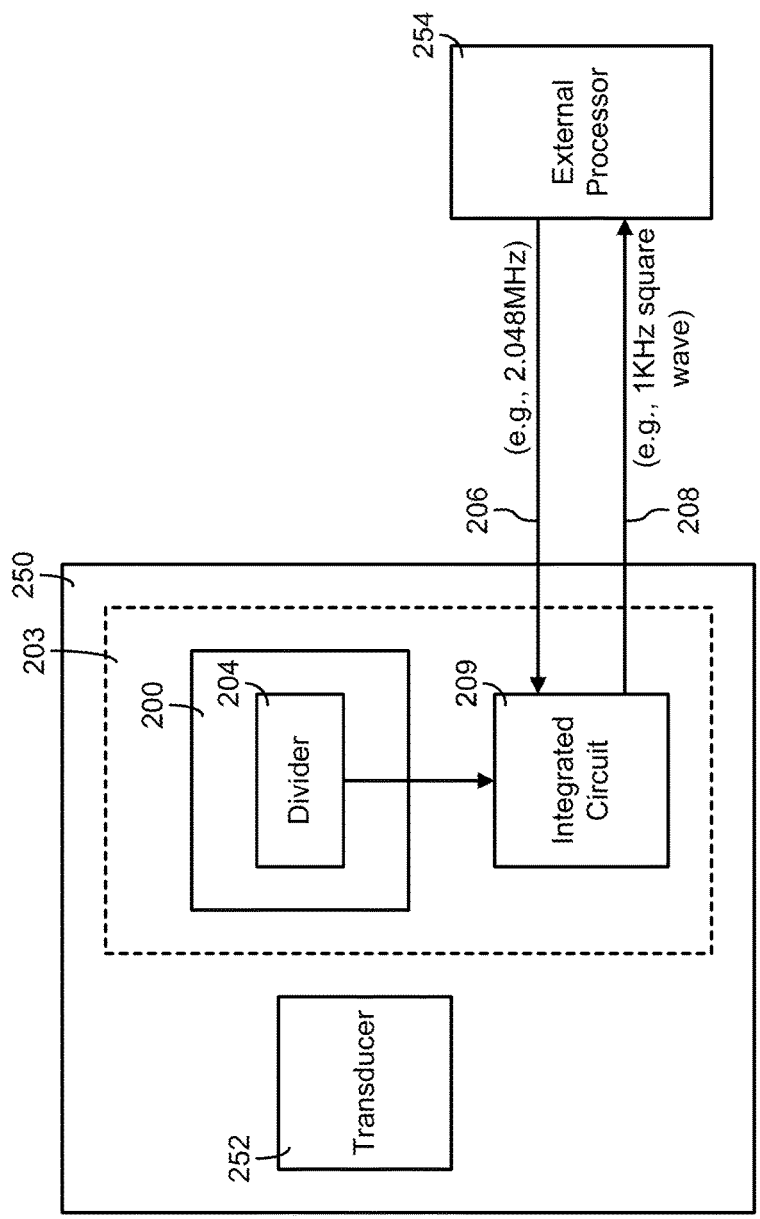
FIG. 2 is a diagram of a calibration signal generation module or circuit in a microphone.

Referring now to FIG. 2, one example of a calibration signal generation module 200 for producing a calibration signal 202 is described. In this example, the clock line from the external processor is used as the indicator. The module 200 resides in a microphone 250 that includes a transducer 252.

The calibration signal generation module 200 includes a frequency divider 204. An external clock signal (e.g., a 2.048 MHz clock) is supplied to the calibration signal generation module 200 from an external processor 254 (e.g., external processor 104) via clock line 206. The frequency divider 204 in this example then divides the clock by 2048 to produce a 1 kHz square wave. This square wave is then transmitted to the integrated circuit 209 (e.g., integrated circuit 124 in FIG. 1) and then to the external processor 254 via a data or output line 208. This calibration signal can be digitized into any standard or format such as pulse density modulation (PDM), pulse code modulation (PCM), I2S, SoundWire, or some other standard or protocol. The amplitude, frequency, or other parameters of the signal may be modified prior to transmitting the calibration signal to the external processor within or outside the calibration signal generation module 200. The square wave can be transmitted to a transducer (e.g., transducer 122) as well.

In some examples, the calibration signal is derived from the indicator signal. In other examples, it is not derived from the indicator signal.

It will be appreciated that the calibration signal can be sent from the integrated circuit (e.g., integrated circuit 124 of FIG. 1) as in the previous example or directly from the signal calibration module itself. It will also be understood that the indicator/invoke command may also be sent to the integrated circuit (e.g., integrated circuit 124 of FIG. 1) or the signal calibration module 200. It will also be appreciated that the integrated circuit and signal calibration module may optionally reside on a single integrated circuit (labeled 203 in FIG. 2), but are shown independently in FIG. 2 for functional purposes.

It will be appreciated that the example of FIG. 2 shows one calibration signal generation module and that other examples are possible.

Preferred embodiments are described herein, including the best mode known to the inventors. It should be understood that the illustrated embodiments are exemplary only, and should not be taken as limiting the scope of the appended claims.

What is claimed is:

1. A microphone comprising:
   a calibration signal generator configured to generate a calibration signal based upon a received invocation input, wherein the calibration signal has known audio properties;
   a transducer configured to convert sound energy into an electrical signal;
   an integrated circuit configured to receive the electrical signal from the transducer; and
   an external microphone interface configured to provide the calibration signal to a device external to the microphone.

2. The microphone of claim 1, wherein the microphone operates in a calibration mode, a sleep mode, or an active mode, wherein the calibration signal is provided only in the calibration mode.

3. The microphone of claim 1, wherein the integrated circuit is configured to:
   receive the invocation input; and
   transmit the invocation input to the calibration signal generator.

4. The microphone of claim 1, wherein the calibration signal generator is configured to pass the calibration signal to the integrated circuit, wherein the integrated circuit provides the calibration signal to the external microphone interface.

5. The microphone of claim 4, wherein the integrated circuit is further configured to pass the calibration signal to the transducer.

6. The microphone of claim 1, wherein the invocation input comprises a clock pattern.

7. The microphone of claim 6, wherein the clock pattern comprises a first frequency in a first time period and a second different frequency in a second later time period.

8. The microphone of claim 1, wherein the calibration signal is derived from the received invocation input.

9. The microphone of claim 1, wherein the calibration signal generator comprises a frequency divider configured to divide a clock signal.

10. The microphone of claim 9, wherein the frequency divider is further configured to output a square wave.

11. The microphone of claim 10, wherein the frequency divider is further configured to provide the square wave to the integrated circuit.

12. The microphone of claim 10, wherein the square wave is the calibration signal.

13. A microphone comprising:
   a calibration signal generator configured to:
   receive an external clock signal;
   divide the external clock signal; and
   generate a calibration signal based upon a received invocation input, wherein the calibration signal has known audio properties and is derived from the divided external clock signal;
   a transducer configured to convert sound energy into an electrical signal;
   an integrated circuit configured to receive the electrical signal from the transducer; and
   an external microphone interface configured to provide the calibration signal to a device external to the microphone.

14. The microphone of claim 13, wherein the calibration signal generator is configured to pass the calibration signal to the integrated circuit, wherein the integrated circuit provides the calibration signal to the external microphone interface.

15. A microphone assembly comprising:
   an external-device interface;
   a transducer having an acoustic input and an electrical signal output;
   a processing circuit having an input coupled to the electrical signal output of the transducer, the processing circuit having an output coupled to the external-device interface;
   a calibration signal generation circuit having an input, the calibration signal generation circuit having a calibration signal output coupled to the external-device interface, the calibration signal generation circuit capable of outputting a calibration signal at the external-device interface,
   wherein the calibration signal is an electrical signal.

16. The assembly of claim 15, wherein the calibration signal generation circuit outputs the calibration signal at the external-device interface in response to a calibration signal invocation at the input of the calibration signal generation circuit.

17. The assembly of claim 15, wherein the calibration signal generation circuit outputs the calibration signal at the external-device interface without a need for input at the acoustic input of the transducer.

18. The assembly of claim 15, the processing circuit and the calibration signal generation circuit constitute an integrated circuit, the assembly operating on multiple modes, at least one of the modes is a low power mode and at least another of the modes is a calibration mode, wherein the calibration signal generation circuit provides the calibration signal only in the calibration mode.

19. The assembly of claim 15, the calibration signal has properties for calibration performed by a device external to the microphone assembly.

20. The assembly of claim 15, wherein the calibration signal generation circuit comprising a divider circuit having an input coupled to the external-device interface, wherein the calibration signal is based on a signal at the output of the divider circuit.

* * * * *